United States Patent [19]

Tanaka et al.

[11] Patent Number: 5,111,489
[45] Date of Patent: May 5, 1992

[54] FREQUENCY-DIVIDING CIRCUIT

[75] Inventors: Koutarou Tanaka; Makoto Shikata; Masahiro Akiyama, all of Tokyo, Japan

[73] Assignee: Oki Electric Industry Co., Ltd., Tokyo, Japan

[21] Appl. No.: 586,446

[22] Filed: Sep. 21, 1990

Related U.S. Application Data

[63] Continuation-in-part of Ser. No. 305,419, Feb. 1, 1989, abandoned.

[30] Foreign Application Priority Data

Feb. 9, 1988 [JP] Japan .................................. 63-28475

[51] Int. Cl.[5] ..................... H03K 21/02; H03K 3/356; H03K 17/28
[52] U.S. Cl. .................................. 377/121; 307/247.1; 307/291; 307/593; 307/595; 377/47
[58] Field of Search ..................... 307/247.1, 291, 292, 307/272.2, 593, 595; 328/55; 377/47, 121

[56] References Cited

U.S. PATENT DOCUMENTS

| | | | |
|---|---|---|---|
| 3,131,317 | 4/1964 | Yee ..................... | 307/291 |
| 3,971,960 | 7/1976 | Means et al. ............ | 307/291 |
| 4,051,389 | 9/1977 | Kaneko et al. .......... | 307/291 |
| 4,057,738 | 11/1977 | Nishimura .............. | 307/291 |
| 4,109,209 | 8/1978 | Bismarck ............... | 328/55 |
| 4,476,401 | 10/1984 | Lin ..................... | 328/55 |

Primary Examiner—John S. Heyman
Attorney, Agent, or Firm—Edward D. Manzo

[57] ABSTRACT

In a frequency-dividing circuit for producing an output having a frequency half that of its input, a pair of terminals of a latch circuit are connected to input terminals of a pair of amplify/delay means, and are also connected to receive through a pair of transistors, the outputs of the amplify/delay means. A single-phase input signal is input to the control electrodes of the transistors to turn on and off the transistors. When the transistors are turned from off to on, the output states of the amplify/delay means are transferred through the transistors to invert the latch circuit, and the states of complementary terminals of the latch circuits are in turn transferred through the amplify/delay means to invert the output states of the outputs of the amplify/delay means. When the transistors are turned from on to off, no change occurs in the states of the circuit. In this way, the states of the circuit are inverted each time the transistors are turned from off to on. A frequency-divided output can therefore be derived at one of the outputs of the first and second amplify/delay means. Either one or both of the first and second inverters may be replaced by a NAND gate or a NOR gate for permitting reset of the circuit.

19 Claims, 5 Drawing Sheets

FREQUENCY-DIVIDING CIRCUIT

This is a continuation-in-part of application Ser. No. 07/305,419 filed Feb. 1, 1989, which is now abandoned.

BACKGROUND OF THE INVENTION

The present invention relates to a frequency-dividing circuit in a semiconductor integrated circuit or the like.

A prior art of the field concerned is shown in *Denshi Joho Tsushin Gakkai Soritsu 70-Shunen Kinen Sogo Zenkoku Taikai Koen Ronbunshu* (Papers from the 70th Anniversary Memorial Meeting of the Institute of Electronics, Information and Communication Engineers of Japan), No. 396 (Sho 62), Osafune, Enoki, Muraguchi and Owada "20GHzGaAs Dynamic Frequency-Divider", pages 2-200. This prior art will be explained with reference to the drawings.

Figure 1:
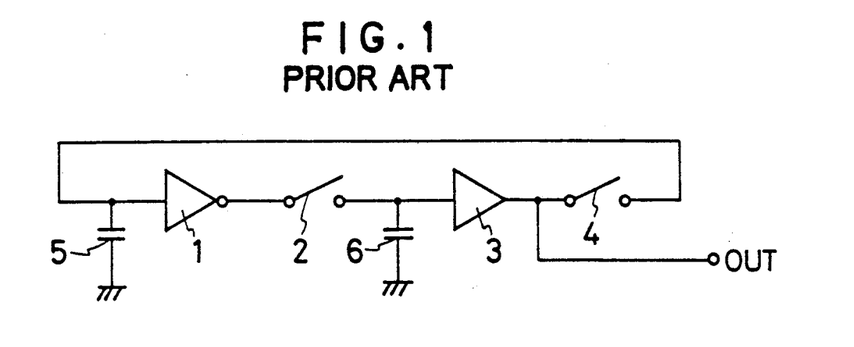
FIG. 1 is a block diagram showing a prior-art frequency-dividing circuit.

FIG. 1 is a block diagram showing an example of a prior art frequency-dividing circuit.

In this frequency-dividing circuit, an inverter 1, a switch 2, a source-follower circuit 3, and a switch 4 are connected in a ring. The inputs of the respective inverters 1 and 3 are connected through capacitors 5 and 6 to the ground. An output terminal OUT is connected to the output of the source-follower circuit 3.

Figure 2:
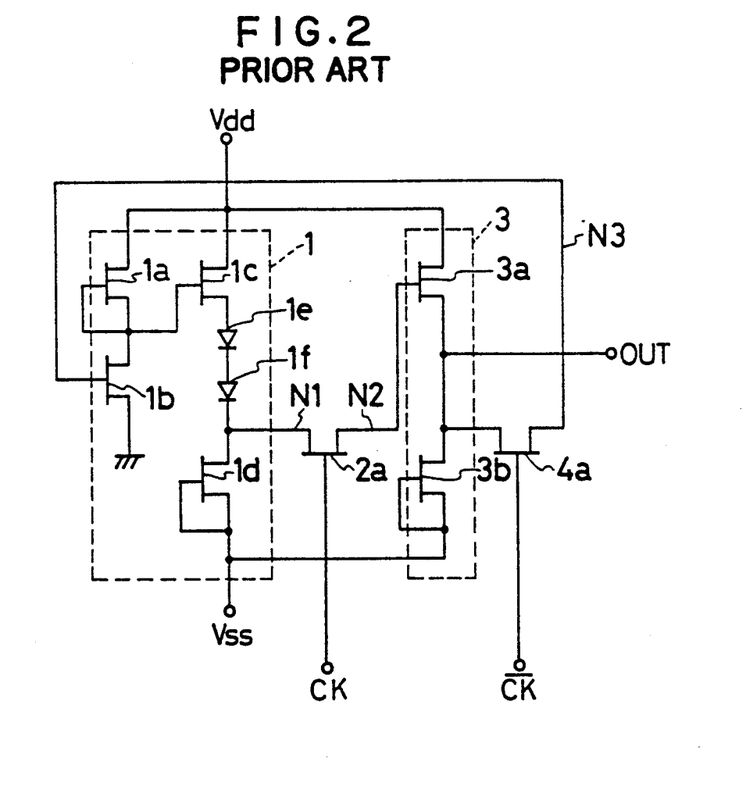
FIG. 2 is a block diagram showing a circuit diagram of the frequency-dividing circuit shown in FIG. 1.

FIG. 2 is a circuit diagram of the frequency-dividing circuit in FIG. 1.

In this frequency-dividing circuit, the inverter 1 is comprised of a field-effect transistor (hereinafter referred to as FET) 1a, 1b, 1c and 1d and Schottky diode 1e and 1f. The switches 2 and 4 are comprised of FETs 2a and 4a, respectively, and the source-follower circuit 3 is comprised of FETs 3a and 3b. The capacitor 5 in FIG. 1 is a representation by a concentrated constant of the input capacitance of the gate of the FET 1b and the capacitance of the wiring conductor connected to the gate. Similarly, the capacitor 6 is a representation by a concentrated constant of the input capacitance of the gate of the FET 3a and the capacitance of the wiring conductor connected to the gate.

Vdd and Vss in FIG. 2 are a first and second power supply potentials, CK is a clock signal, $\overline{CK}$ is an inverted clock signal, and N1, N2 and N3 are nodes.

The operation of the frequency-dividing circuit will first be described with reference to FIG. 1.

It is assumed that, initially, the capacitance 5 is charged, the switch 2 is closed and the switch 4 is open. In this state, a High signal (an "H" level signal) is fed to the input of the inverter 1, and a Low signal (an "L" level signal) is delivered from the output of the inverter 1. Since the switch 2 is closed, the capacitance 6 is discharged and a Low signal is fed to the input of the source-follower circuit 3, and the output of the source-follower circuit 3 is Low.

When the switch 2 is opened, and the switch 4 is closed, since the output of the source-follower circuit 3 is Low, the capacitance 5 is discharged and the input of the inverter 1 becomes Low, and hence the output of the inverter 1 becomes High.

When the switch 2 is closed and the switch 4 is opened, the capacitance 6 is charged by the output of the inverter 1, and a High signal appears at the input of the source-follower circuit 3 and a High signal appears at the output of the source-follower circuit 3.

Accordingly, a signal having a period twice that of the opening and closing period of the switches 2 and 4 is fed to the output terminal OUT connected to the output of the source-follower circuit 3. Thus, the circuit operates as a frequency-dividing circuit.

When the capacitance 5 is charged with the switch 4 open, the charge on the capacitance 5 is discharged by a leak current through the input impedance of the inverter 1 and the switch 4, so it is impossible for this state to continue for a more than a certain time. Similarly, the charge on the capacitance 6 while the switch 2 is open cannot last long because of a leak current through the input impedance of the source-follower circuit 3 and the switch 2. The frequency-dividing circuit therefore operates as a dynamic frequency-dividing circuit which performs the frequency-dividing operation on signals of a period within a certain range which is limited by the charging and discharging time of the capacitances 5 and 6, and the delay time from the input to the output of the inverter 1 and the source-follower circuit 4.

Figure 3:
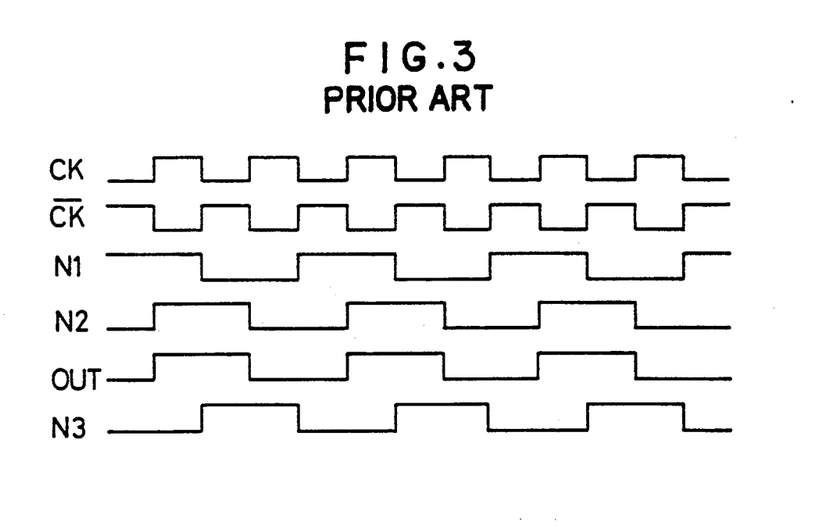
FIG. 3 is a timing chart for explaining the operation of the frequency-dividing circuit of the frequency-dividing circuit shown in FIG. 2.

Next, the operation of the frequency-dividing circuit in FIG. 1 will be described in further detail with reference to the timing chart of FIG. 3.

It is assumed that initially the clock signal CK, the nodes N2 and N3 and the output terminal OUT are Low, while the inverted clock signal $\overline{CK}$ and the node N2 are High. When the clock signal CK changes from Low to High, and the inverted clock signal $\overline{CK}$ changes from High to Low, the signal on the node N1 is transferred through FET 2a to the node N2, and the node N2 therefore changes from Low to High. The output terminal OUT therefore changes from Low to High. When the clock signal CK changes from High to Low, and the inverted clock signal $\overline{CK}$ changes from Low to High, the signal on the output terminal OUT is transferred through the FET 4a to the node N3, and the node N3 therefore changes from Low to High. The node N1 therefore changes from High to Low. In this way, a signal having a period twice that of the clock signal CK and the inverted clock signal $\overline{CK}$ appears at the output terminal OUT. The circuit thus operates as a frequency-dividing circuit.

The frequency-dividing circuit of the structure described above has the following problems.

In the frequency-dividing circuit in FIG. 2, if there is a delay between the phases of the clock signal CK and the inverted clock signal $\overline{CK}$, and the interval for which they are both Low or both High is long, in which interval the levels on the various nodes are indefinite, and the circuit fails to operates successfully as a frequency-dividing circuit. That is, this circuit requires two-phase clock signals to be input, and their phases to be adjusted optimally.

SUMMARY OF INVENTION

An object of the invention is to solve the above problems of the prior art.

Another object of the invention is to provide a frequency-dividing circuit which does not require two-phase clock signals and whose operation is not greatly affected by the phase difference of the two-phase clock signals.

A frequency-dividing circuit according to the invention comprises:

a latch circuit (20) having a first and second complementary terminals (N21, N22);

a first and second delay means (31, 32) for delaying an input thereto;

a first and second switches (11, 12) having a control electrode connected to receive an input signal (CK), each of said transistors being turned on and off by means of the input signal applied to its control electrode;
wherein
said first complementary terminal (N21) is connected to the input of said second delay means (32) and connected to receive through said second switch (12) either the output of said first delay means (31) or the output of said second delay means (32); and
said second complementary terminal (N22) is connected to the input of said first delay means (31) and connected to receive through said first switch (11) either the output of said second delay means (32) or the output of said first delay means (31).

In the frequency-dividing circuit configured as described above, the latch circuit serves to temporarily store the states of the circuit. When the switches are turned from off to on the outputs of the first and second delay means are transferred through the switches to invert the latch circuit, and the new states of complementary terminal of the latch circuit are transferred through the delay means and appear at the outputs of the delay means. This means that the states of the circuit are inverted. This inversion takes place each time the switches are turned from off to on, while the states of the circuit do not change when the switches are turned from on to off. The propagation delay time through the switches and the delay means should be so set as to be longer than the time for which the input signal assumes the level for turning on the switches, and shorter than the period of the input signal.

DETAILED DESCRIPTION OF THE EMBODIMENTS

Figure 4:
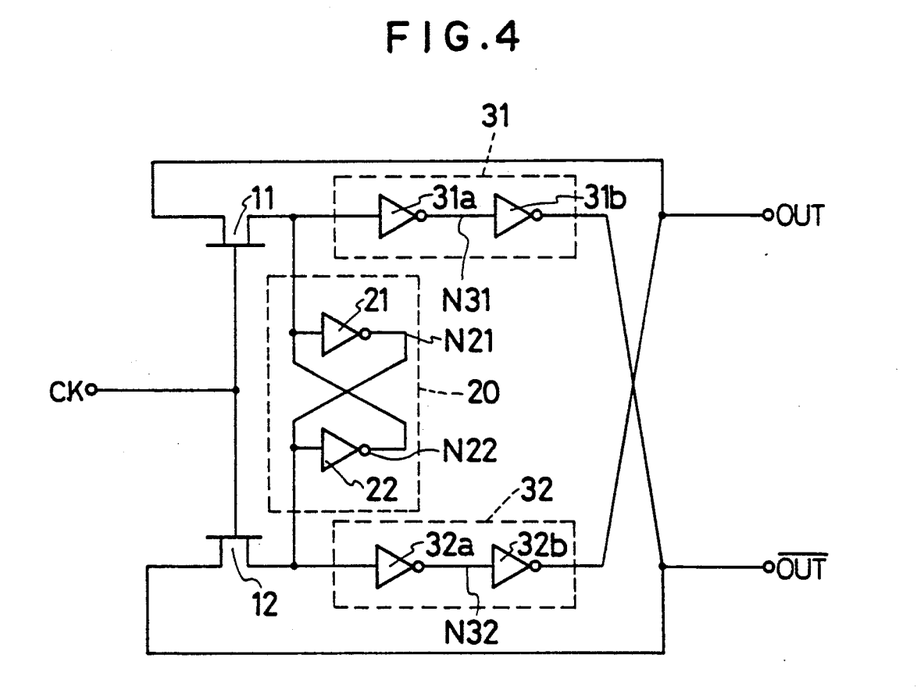
FIG. 4 is a block diagram showing a frequency-dividing circuit of a first embodiment of the invention.

FIG. 4 is a block diagram showing a frequency-dividing circuit of an embodiment of the invention.

This frequency-dividing circuit comprises a latch circuit 20 having a first and second complementary terminals or nodes N21 and N22. The latch circuit 20 of this embodiment comprises a first and second inverters 21 and 22. The output of the first inverter 21 forms the first complementary terminal N21 and is connected to the input of the second inverter 22. Similarly, the output of the second inverter 22 forms the second complementary terminal N22 and is connected to the input of the first inverter 21. In other words, these inverters 21 and 22 are cross-coupled.

The frequency-dividing circuit further comprises a first and second transistors, e.g., first and second FETs 11 and 12, turned on and off by a clock signal CK. The gates (control electrode) of the FETs 11 and 12 are connected to receive the clocksignal CK. The source (second electrode) of the first FET 11 is connected to the input of the first inverter 21, the output of the second inverter 22 and the input of a first amplify/delay circuit in the form of a first inverter series 31. The source (second electrode) of the second FET 12 is connected to the output of the first inverter 21, the input of the second inverter 22 and the input of a second amplify/delay circuit in the form of a second inverter series 32. The first and second FETs 11 and 12, and the first and second inverters 21 and 22 have a function of temporarily storing their input in accordance with the clock signal CK. The first amplify/delay circuit 31 comprises a cascade connection of an even number of inverters 31a and 31b. The first inverter 31a constitutes an amplifying inverter while the second inverter 31b constitutes a delay circuit. The first amplify/delay circuit 31 thus comprises the amplifying inverter 31a and the delay circuit 31b. The output of the amplify/delay circuit 31 is connected to the drain (first electrode) of the second FET 12, and the inverted output terminal $\overline{OUT}$. Similarly, the second amplify/delay circuit 32 comprises a cascade connection of an even number of inverters 32a and 32b. The first inverter 32a constitutes an amplifying inverter while the second inverter 32b constitutes a delay circuit. The second amplify/delay circuit 32 thus comprises the amplifying inverter 32a and the delay circuit 32b. The output of the amplify/delay circuit 32 is connected to the drain (first electrode) of the first FET 11, and the output terminal OUT. The first and second inverter series 31 and 32 have a function of delaying their inputs, i.e., the outputs of the first and second inverters 21 and 22 for a predetermined time. Where each of the inverter series 31 and 32 comprises an even number of cascaded inverters the output of the inverter series is nearly in phase with and delayed with respect to the input of the inverter series. The inverter series 31 and 32 also serve to provide a required driving power at their outputs. The nodes N21 and N22 are connected to receive through the transistors 12 and 11, the outputs of the inverter series 31 and 32, respectively.

In the drawings, N31 is an output node of the inverter 31a, and N32 is an output node of the inverter 32a.

Figure 5:
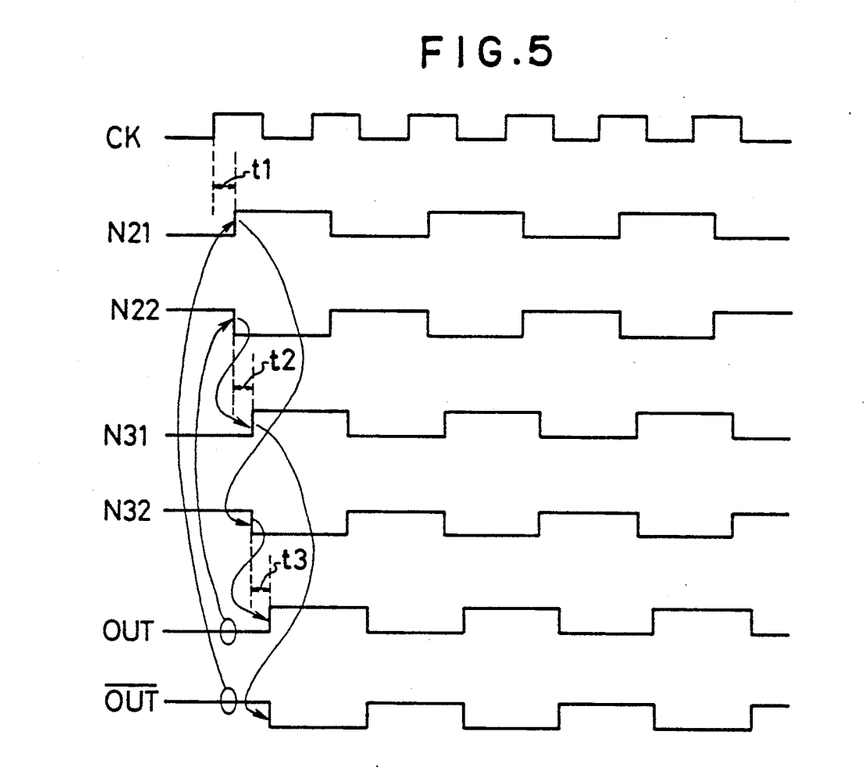
FIG. 5 is a timing chart for explaining the operation of the frequency-dividing circuit shown in FIG. 4.

FIG. 5 is a timing chart for explaining the operation of the frequency-dividing circuit shown in FIG. 4.

It is assumed that initially the node N21 is Low, the node N22 is High, and the clock signal CK is Low, the node N31 and the output terminal OUT are Low, and the node N32 and the inverted output terminal $\overline{OUT}$ are High. When the clock signal CK changes from Low to High, the signals on the output terminal OUT and the inverted output terminal $\overline{OUT}$ are transferred through the FETs 11 and 12 to the nodes N22 and N21, so after a delay time t1 of the FETs 11 and 12, the levels on the nodes N21 and N22 change from Low to High, and from High to Low, respectively, and after a further delay time t2 of the inverters 31a and 32a, the levels on the nodes N31 and N32 change from Low to High, and from High to Low, respectively. After a further delay time t3 of the inverters 31b and 32b, the output terminal OUT and the inverted output terminal $\overline{OUT}$ change from Low to High, and from High to Low, respectively.

When the clock signal CK next changes from High to Low, the states of the circuit are unchanged. That is, the nodes N21 and N31, and the output terminal OUT are kept High, while the nodes N22 and N32, and the inverted output terminal $\overline{\text{OUT}}$ are kept Low.

When the clock signal CK thereafter changes from Low to High, the signals on the output terminal OUT and inverted output terminal $\overline{\text{OUT}}$ are transferred through the FETs 11 and 12 to the nodes N21 and N22 to invert the levels on the nodes N22 and N21.

When the clock signal CK next changes from High to Low, the states of the circuit are unchanged. Similar operation will thereafter repeated. In this way, each time the clock signal Ck rises to High, the states of the circuit change, while no change occur when the clock signal CK falls to Low, and a signal having a period twice that of the applied clock signal CK is output from the output terminal OUT and inverted output terminal $\overline{\text{OUT}}$. Thus, the circuit operates as a frequency-dividing circuit.

If the time for which the clock signal CK is High is longer than the time (t1 + t2 + t3), the signals on the output terminal OUT and inverted output terminal $\overline{\text{OUT}}$ are transferred to the FETs 11 and 12 to the nodes N21 and N22 to invert the levels on the nodes N21 and N22 and then transferred through the inverter series 31 and 32 to the output terminal OUT and inverted output terminal $\overline{\text{OUT}}$ to invert the signals on the output terminal OUT and inverted output terminal $\overline{\text{OUT}}$. Accordingly, the levels on the nodes N21 and N22 are again inverted, so the circuit does not operate as a frequency-dividing circuit. For this reason, the time for which the clock signal CK is High, or in other words, at a level for turning on the transistor 11 and 12 should be shorter than a propagation delay time from the one of the output terminals (OUT or $\overline{\text{OUT}}$), i.e., the output of one of said inverter series (31 or 32) through the transistor (11 or 12) and the other inverter series (32 or 31) to the other output terminal ($\overline{\text{OUT}}$ or OUT), i.e., the output of the other inverter series (32 or 31). This places a lower limit to the frequency of the clock signal CK. If, on the other hand, the period of the clock signal CK is shorter than the time (t1 + t2 + t3), again the circuit does not operate as a frequency-dividing circuit. For this reason, the period of the clock signal CK should be longer than the propagation delay time (t1 + t2 + t3). This places an upper limit to the frequency of the clock signal CK. This means, that the circuit operates as a frequency-dividing circuit which operates responsive to frequencies within a certain range.

As has been described, this frequency-dividing circuit operates responsive to a single-phase clock signal CK, so it is not necessary to adjust the phases of two-phase clock signals as in the prior-art circuit. The circuit is therefore a more reliable frequency-dividing circuit. Moreover, the delay path which determines the operation speed is comprised of two stages of inverters and one stage of FETs, and is shorter than the prior-art circuit (comprising two stages of gates and two stages of FETs), so the circuit can operate in a higher frequency range.

To use the frequency-dividing circuit at a low frequency, the number of the stages of the inverters in the first and second inverter series 31 and 32 can be increased to increase the delay time of the delay path. An illustrative example of this scheme is shown in FIG. 6.

Figure 6:
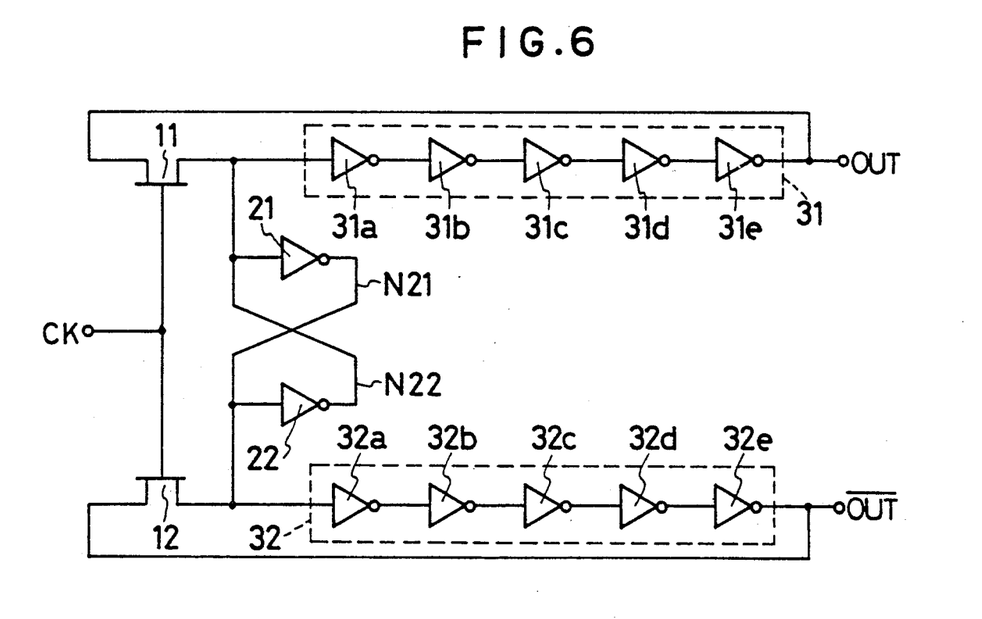
FIG. 6 and FIG. 7 are block diagrams showing frequency-dividing circuits of a second and third embodiments of the invention.

FIG. 6 is a block diagram showing a frequency-dividing circuit of a second embodiment of the invention.

In this frequency-dividing circuit, the first and second inverter series are formed of inverters 31a to 31e and 32a to 32e, respectively, in five stages. In this embodiment, the first inverter 31a in the first inverter series 31 constitutes the amplifying inverter, and the remaining inverters 31b to 31e constitute the delay circuit. Similarly, the first inverter 32a in the second inverter series 32 constitutes the amplifying inverter, and the remaining inverters 32b to 32e constitute the delay circuit. Because of the increased number of stages in the inverter series, the delay time is increased, so that the circuit can operate at a lower frequency range.

It should also be noted that in this embodiment, the first and second inverter series are formed of an odd number of stages of inverters. In this case, the output of each inverter series is nearly an inversion of and delayed with respect to the input of the inverter. The connection of the outputs of the inverter series is therefore different from that in the embodiment of FIG. 4. That is, the output of the first inverter series 31 is connected to the output terminal OUT and the drain of the first FET 11, and the output of the second inverter series 32 is connected to the inverted output terminal $\overline{\text{OUT}}$ and the drain of the second FET 12. In other words, the node N21 is connected to receive the output of the second inverter series 32, while the node N22 is connected to receive the output of the first inverter series 31.

Figure 7:
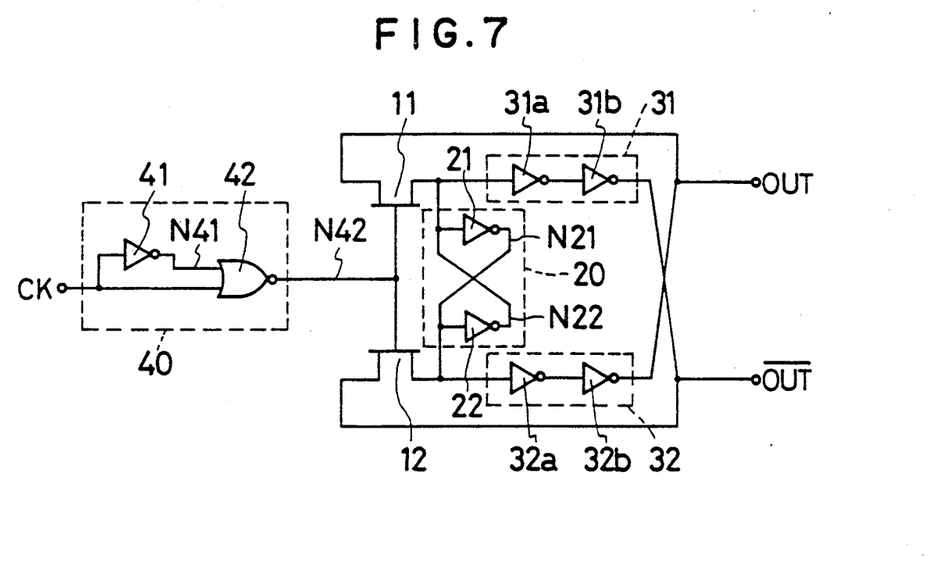

FIG. 7 is a block diagram showing a frequency-dividing circuit of a third embodiment of the invention.

This frequency-dividing circuit is identical to the frequency-dividing circuit in FIG. 4 except that a pulse generating circuit 40 is added. The pulse generating circuit 40 comprises an inverter 41 for inverting the clock signal CK, and a NOR gate 42 performing a NOR operation on the signal on the output node of the inverter 41 and the clock signal CK and delivering its output to the gates of the first and second FETs 11 and 12.

As was described earlier, in the circuit of FIG. 4, while the clock signal CK is Low, the states of the circuit is unchanged, i.e., the levels on the respective nodes are kept unchanged. Accordingly, by the addition of the pulse generating circuit 40 shown in FIG. 7 which produces a pulse having a shorter High interval from a clock signal CK having High/Low ratio of about 1. As was stated earlier, the requirement that the High interval of the signal applied to the FETs 11 and 12 should be shorter than the propagation delay time places a lower limit to the frequency of the signal that is applied to the gates of the FETs. By shortening the High interval of the signal applied to the gates of the FETs, without changing the period of the signal, the lower frequency limit of the signal which the circuit can handle can be effectively extended.

Figure 8:
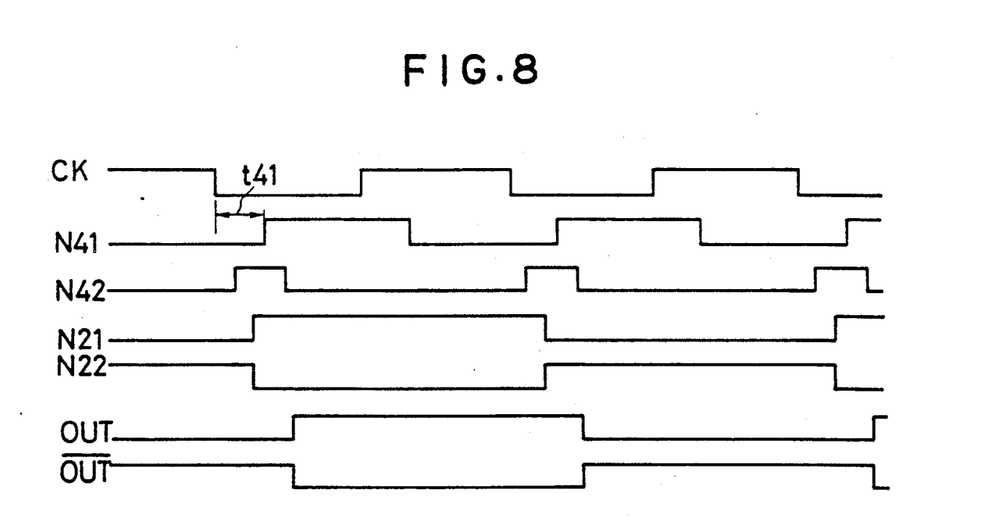
FIG. 8 is a timing chart for explaining the operation the frequency-dividing circuit shown in FIG. 7.

FIG. 8 is a timing chart of FIG. 7. The operation of FIG. 7 will now be described with reference to this figure.

Responsive to the input clock signal CK, a signal having an inverted phase appears at the node N41, being delayed by the delay time t41 of the inverter 41. This signal and the clock signal CK are NORed by the NOR gate 42, so that a pulse whose High interval is t41 appears on the node N42 as shown in FIG. 8. As explained with reference to FIG. 5, with the clock signal CK having a High interval longer than the propagation delay time of the frequency-dividing circuit, the circuit of FIG. 4 does not operate properly. Responsive to the clock signal at the node N42 in FIG. 8, whose High interval is t41, the circuit of FIG. 7 can operate properly. This means, by the addition of the pulse generating circuit, it is possible to effectively lower the lower limit of the frequency of the signal which the frequency-dividing circuit can handle.

Figure 9:
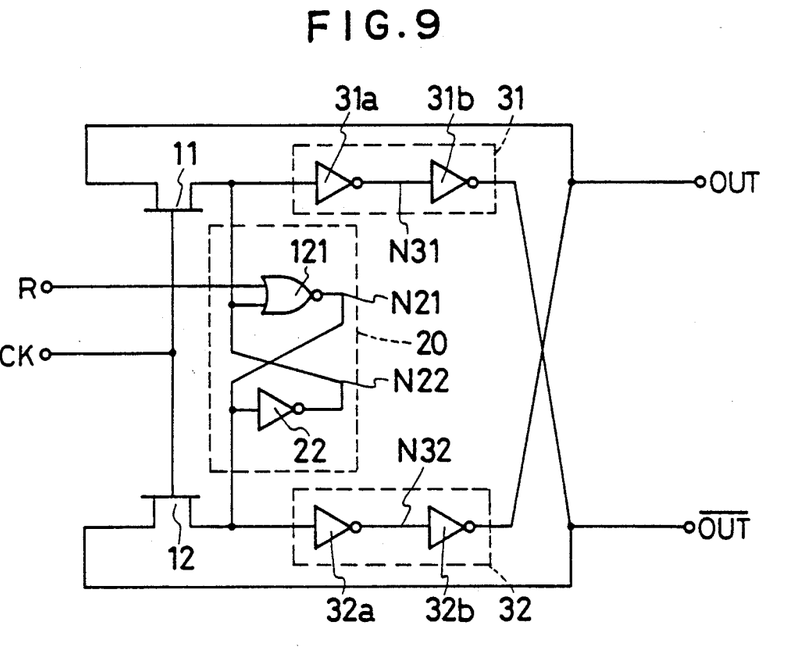
FIG. 9 is a block diagram showing a frequency-dividing circuit of a fourth embodiment of the invention.

FIG. 9 is a block diagram showing a frequency-dividing circuit of a fourth embodiment of the invention.

This frequency-dividing circuit is identical to the frequency-dividing circuit in FIG. 4 except that the first inverter 21 is replaced by a NOR gate 121. With this configuration, the circuit can operate as a frequency-dividing circuit having a reset function in which the initial state of the nodes N21, N22, N31 and N32 can be determined by a control signal R. When the control signal R is made to be High, the circuit is reset. It is also possible to replace the second inverter 22 with a NOR gate, or to replace both of the first and second inverters 21 and 22 in FIG. 4 with a NOR gate.

Figure 10:
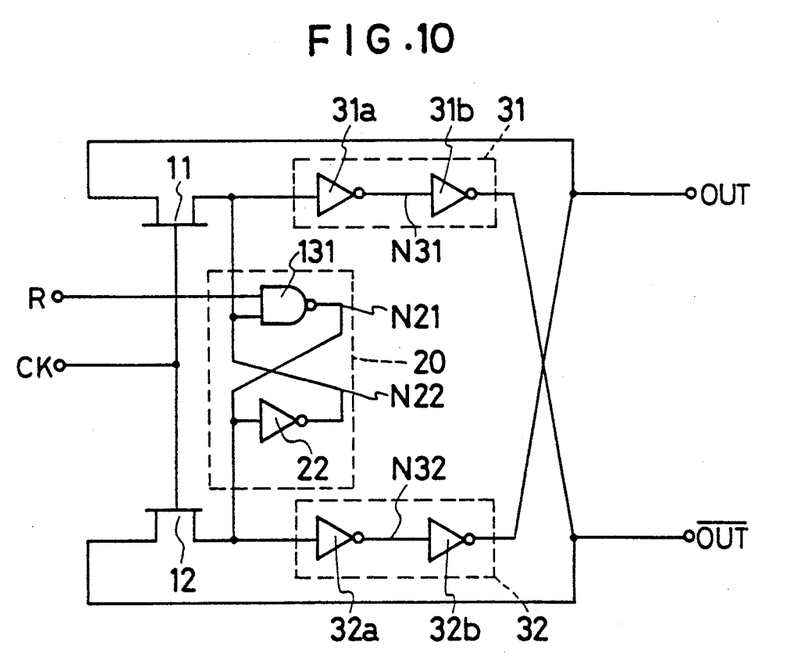
FIG. 10 is a block diagram showing a frequency-dividing circuit of a fifth embodiment of the invention.

FIG. 10 is a block diagram showing a frequency-dividing circuit of a fifth embodiment of the invention.

This frequency-dividing circuit is identical to the frequency-dividing circuit in FIG. 9 except that the NOR gate 121 is replaced by a NAND gate 131. With this configuration as well, the circuit can operate as a frequency-dividing circuit having a reset function in which the initial state of the Nodes N21, N22, N31 and N32 can be determined by a control signal R. When the control signal R is made to be Low, the circuit is reset.

Similar modification as mentioned with reference to the embodiment of FIG. 9 can be made to the embodiment of FIG. 10. That is, it is also possible to replace the second inverter 22 in the embodiment of FIG. 1 with a NAND gate, or to replace both of the first and second inverters 21 and 22 in FIG. 4 with a NAND gate.

It will be clear from the description of the embodiments of FIG. 9 and FIG. 10, that the latch circuit 20 can comprise a pair of inverting circuits, each of which may be a simple inverter, a NOR gate or a NAND gate, having an input and an output for producing a signal which is an inversion of the signal applied to the input. The term "inverting circuit" as used in the claims should therefore be construed to cover, not only simple inverters as used in the embodiment of FIG. 4, but also the NOR gates and the NAND gates as used in the embodiments of FIG. 9 and FIG. 10.

The invention is not limited to the embodiment described above, but various modifications are possible. For instance, the first and second transistors may be formed of transistors other than FETs 11 and 12. Moreover, in place of transistors, any other types of switches may be used as far as they have a control electrode and are capable of being turned on and off in accordance with a signal applied to the control electrode. Furthermore, the delay circuit in the inverter series (31 and 32) may be replaced with any other types of delay means which is capable of delaying an input thereto and producing an output signal nearly in phase with or nearly an inversion of, and delayed with respect to the input.

In the embodiment described above, the amplifying inverter is provided in front of the delay circuit. But, the amplifying inverter may alternatively be provided at the back of the delay circuit, or, where the delay circuit is divided into two parts, between first and second parts of the delay circuit.

As has been described, according to the invention, a latch circuit is provided to latch the state of the circuit, and when the switches are turned on by an input clock signal, the states of the output terminals are transferred through the switches to invert the latch circuit, and further transferred through the amplify/delay circuit output terminals. The delay time can be so set as to be longer than the period for which the input clock signal assume the level for turning on the switches, and shorter than the period of the input clock signal. An advantage of the invention is that a single-phase clock signal can be used for operating a frequency-dividing circuit. This eliminates the need to adjust the phases of the clock signals which was necessary when a two-phase clock signal was used as in the prior art. Moreover, the operating speed of the circuit can be increased and the reliability of the circuit is improved. Furthermore, if the first and second inverters are replaced with a NOR gate or a NAND gate, the circuit can be made to perform reset operation or the like, in accordance with a control signal. Thus, the function of the circuit can be enhanced.

What is claimed is:

1. A frequency-dividing circuit comprising:
    a latch circuit (20) having a first and second complementary terminals (N21, N22);
    first and second amplify/delay circuits (31, 32) each having an input and an output, each of said first and second amplify/delay circuits comprising a cascade coupling of an amplifying inverter and a delay circuit, said amplifying inverter being arranged to drive said latched circuit; and
    first and second switches (11, 12) each having a respective control electrode, said control electrodes being coupled to receive an input signal (CK, N42) alternately assuming a first state or a second state, each of said switches so connected as to be simultaneously conductive when said input signal is in said first state and simultaneously nonconductive when said input signal is in said second state, each said switch coupling an output from a respective one of said amplify/delay circuits to a respective one of said complementary terminals and to an input of said the amplify/delay circuit.

2. A frequency-dividing circuit according to claim 1, wherein
    each of said switches (11, 12) comprises a field-effect transistor having first and second main electrodes and being turned on and off across the first and second main electrodes by the control signal applied to the control electrode;
    said first complementary terminal (N21) is connected to said second main electrode of the transistor forming said second switch (12);
    said second complementary terminal (N22) is connected to said second main electrode of the transistor forming said first switch (11); and
    each of said first main electrodes is coupled to receive a respective predetermined output selected from the first amplify/delay circuit and the second amplify/delay circuit.

3. A frequency-dividing circuit according to claim 1, wherein a frequency-divided output is derived at at least one of the outputs of said first and second amplify/delay circuits (31, 32).

4. A frequency-dividing circuit according to claim 1, wherein each of the first and second amplify/delay circuits (31, 32) is formed of an even number of cascaded inverters, said first complementary terminal (N21) of said latch circuit (20) is connected to receive the output of said first amplify/delay circuit (31), via said second switch, and said complementary terminal (N22) of said latch circuit (20) is connected to receive the output of said second amplify/delay circuit (32) via said first switch.

5. A frequency-dividing circuit according to claim 1, wherein each of the first and second amplify/delay circuits (31, 32) is formed of an odd number of inverters, said first complementary terminal (N21) of said latch circuit (20) is connected to receive the output of said second amplify/delay circuit (32) via said second switch, and said second complementary terminal (N22) of said latch circuit (20) is connected to receive the output of said first amplify/delay circuit via said first switch (31).

6. A frequency-dividing circuit according claim 1, wherein
   said latch circuit (20) comprises a first and second inverting circuits (21, 22);
   said first inverting circuit (21) has an output terminal connected to said first complementary terminal (N21) and an input terminal connected to second complementary terminal (N22);
   said second inverting circuit (22) has an output terminal connected to said second complementary terminal (N22) and an input terminal connected to said first complementary terminal (N21); and
   each of said first and second inverting circuits (21, 22) outputs a signal which is an inversion of a signal applied to the input terminal.

7. A frequency-dividing circuit according to claim 6, wherein at least one of said first and second inverting circuits (21, 22) comprises an inverter having an input and output respectively constituting the input and output of the inverting circuit.

8. A frequency-dividing circuit according to claim 6, wherein at least one of said first and second inverting circuits (21, 22) comprises a NOR gate having a first input and an output respectively constituting the input and output of the inverting circuit, and having a second input receiving a control signal for resetting the frequency-dividing circuit.

9. A frequency-dividing circuit according to claim 7, wherein at least one of said first and second inverting circuits (2!, 22) comprises a NAND gate having a first input and an output respectively constituting the input and output of the inverting circuit, and having a second input receiving a control signal for resetting the frequency-dividing circuit.

10. A frequency-dividing circuit according to claim 1, wherein the time for which the input signal (CK) is at a level for turning on the switches (11, 12) is shorter than a delay time from the output of one of said amplify/delay circuits (31 or 32) through one of said switches (11, 12) and the other amplify/delay circuit (32 or 31) to the output of said other amplify/delay circuit (32 or 31), and the period of the input signal is longer than said delay time.

11. A frequency-dividing circuit according to claim 1, further comprising means for reducing the interval for which the input signal assumes said first state.

12. A frequency-dividing circuit according to claim 11, wherein said means for reducing the interval comprises an inverter receiving an input signal, and a NOR gate receiving the output of the inverter and said input signal, and the output of the NOR gate is applied to the control electrodes of the switches.

13. A frequency-dividing circuit comprising:

a latch circuit (20) having a first and second complementary terminals (N21, N22), said latch circuit comprising a first and second inverting circuits (21, 22), said first inverting circuit having an output terminal connected to said first complementary terminal (N21) and an input terminal connected to said second complementary terminal (N22), said second inverting circuit having an output terminal connected to said second complementary terminal (N22) and an input terminal connected to said first complementary terminal (N21), each of said first and second inverting circuits outputting a signal which is an inversion of a signal applied to the input terminal;

first and second amplify/delay circuits (31, 32) for delaying signals applied to respective inputs thereof, each of said first and second amplify/delay circuits comprising a cascade coupling of an amplifying inverter and a delay circuit, said amplifying inverter being arranged to drive said latch circuit;

first and second field-effect transistors (11, 12) each having first and second main electrodes and a control electrode connected to receive an input signal (CK, N42) alternately assuming a first state or a second state, each of said transistors being so connected as to be simultaneously conductive across their first and second main electrodes when said input signal is in said first state, and simultaneously nonconductive when said input signal is in second state;

wherein said first complementary terminal (N21) is connected to said second main electrode of said second transistor (12) and the input of said second amplify/delay circuit (32);

said second complementary terminal (N22) is connected to said second main electrode of said first transistor (11) and the input of said first amplify/-delay circuit (31); and each said transistor coupling an output from a respective one of said amplify/delay circuit to a respective on of said complementary terminals.

14. A frequency-dividing circuit according to claim 13, wherein a frequency-divided output is derived at at least one of the outputs of said first and second amplify/delay circuits (31, 32).

15. A frequency-dividing circuit comprising:

a latch circuit having a first and second complementary terminals (N21, N22);

first and second amplify/delay circuits (31, 32) for delaying signals applied to respective inputs thereof;

each of said first and second amplify/delay circuits comprising a cascade coupling of an amplifying inverter and a delay circuit, said amplifying inverters being arranged to drive said latch circuit;

each of the first and second amplify/delay circuits producing an output which is nearly in phase but delayed with respect to its input;

first and second switches (11, 12) each having a control electrode connected to receive an input signal (CK, N42) alternately assuming a first state or a second state, each of said switches so connected as to be simultaneously conductive when said input signal is in said first state and simultaneously nonconductive when said input signal is in said second state;

wherein said first complementary terminal (N21) is connected to the input of said second amplify/- delay circuit (32) and connected to receive through said second switch (12) the output of said first amplify/delay circuit (31); and said second complementary terminal (N22) is connected to the input of said first amplify/delay circuit (31) and connected to receive through said first switch (11) the output of said second amplify/delay circuit (32).

16. A frequency-dividing circuit according to claim 15, wherein each of said first and second amplify/delay circuits (31, 32) is formed of a cascade coupling of an even number of inverters.

17. A frequency-dividing circuit comprising:
a latch circuit having a first and second complementary terminals (N21, N22);
first and second amplify/delay circuits (31, 32) for delaying signals applied to respective inputs thereof;
each of said first and second amplify/delay circuits comprising a cascade coupling of an amplifying inverter and a delay circuit, said amplifying inverters being arranged to drive said latch circuit;
each of the first and second amplify/delay circuits producing an output which is nearly an inversion of and delayed with respect to its input;
first and second switches (11, 12) each having a controlled electrode connected to receive an input signal (CK, N42) alternately assuming a first state or a second state, each of said switches so connected as to be simultaneously conductive when said input signal is in said first state and simultaneously nonconductive when said input signal is in said second stage;
wherein said first complementary terminal (N21) is connected to the input of said second amplify/delay circuit (32) and connected to receive through said second switch (12) the output of said second amplify/delay circuit (32); and
said complementary terminal (N22) is connected to the input of said first amplify/delay circuit (31) and connected to receive through said first switch (11) the output of said first amplify/delay circuit (31).

18. A frequency-dividing circuit according to claim 17, wherein each of said amplify/delay circuits is formed of a cascade coupling of an odd number of inverters.

19. A method of frequency dividing a single input signal alternately assuming a first state and a second state, comprising the steps of:
simultaneously turning on a pair of switches when said input signal is in said first state;
simultaneously turning off the pair of switches when said input signal is in said second state;
providing inputs to parallel amplify/delay paths, in each of which the input is repeatedly inverted from a latch and since and which each said amplify/delay path drives said latch;
coupling output from parallel amplify/delay paths via said switches to said latch so that the said state of the latch is inverted each time the switches are operated; and
taking an output signal from one of the amplify/delay paths.

* * * * *